(12) United States Patent
Hsu et al.

(10) Patent No.: US 11,205,603 B2
(45) Date of Patent: Dec. 21, 2021

(54) SEMICONDUCTOR PACKAGE AND METHOD MANUFACTURING THE SAME

(71) Applicant: Taiwan Semiconductor Manufacturing Co., Ltd., Hsinchu (TW)

(72) Inventors: Feng-Cheng Hsu, New Taipei (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/893,429

(22) Filed: Jun. 4, 2020

(65) Prior Publication Data

US 2020/0303277 A1 Sep. 24, 2020

Related U.S. Application Data

(63) Continuation of application No. 16/402,239, filed on May 3, 2019, now Pat. No. 10,707,142, which is a
(Continued)

(51) Int. Cl.
*H01L 23/31* (2006.01)
*H01L 25/065* (2006.01)
(Continued)

(52) U.S. Cl.
CPC ........ *H01L 23/3135* (2013.01); *H01L 21/568* (2013.01); *H01L 23/3128* (2013.01); *H01L 23/481* (2013.01); *H01L 23/5383* (2013.01); *H01L 25/0652* (2013.01); *H01L 21/561* (2013.01); *H01L 2224/16225* (2013.01); *H01L 2225/0652* (2013.01); *H01L 2225/06517* (2013.01); *H01L 2225/06548* (2013.01); *H01L 2225/06572* (2013.01)

(58) Field of Classification Search
CPC combination set(s) only.
See application file for complete search history.

(56) References Cited

U.S. PATENT DOCUMENTS

| 8,633,598 B1 | 1/2014 | St. Amand |
| 8,993,380 B2 | 3/2015 | Hou et al. |

(Continued)

FOREIGN PATENT DOCUMENTS

| CN | 104465577 | 3/2015 |

OTHER PUBLICATIONS

"Office Action of China Counterpart Application", dated Aug. 19, 2021, p. 1-p. 12.

*Primary Examiner* — Feifei Yeung Lopez
(74) *Attorney, Agent, or Firm* — JCIPRNET

(57) ABSTRACT

A semiconductor package including at least one integrated circuit component and a glue material is provided. The at least one integrated circuit component has a top surface with conductive terminals and a backside surface opposite to the top surface. The glue material encapsulates the at least one integrated circuit component, wherein a first lateral thickness of the glue material is smaller than a second lateral thickness of the glue material, the second lateral thickness is parallel to the first lateral thickness, and the first lateral thickness is substantially coplanar with the top surface.

20 Claims, 9 Drawing Sheets

Related U.S. Application Data continuation of application No. 15/854,720, filed on Dec. 26, 2017, now Pat. No. 10,283,428.

(60) Provisional application No. 62/527,044, filed on Jun. 30, 2017.

(51) Int. Cl.
    *H01L 23/538*     (2006.01)
    *H01L 23/48*     (2006.01)
    *H01L 21/56*     (2006.01)

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,524,959 B1 * | 12/2016 | Yeh | H01L 24/96 |
| 9,666,502 B2 | 5/2017 | Chen et al. | |
| 9,735,131 B2 | 8/2017 | Su et al. | |
| 2008/0094815 A1 * | 4/2008 | Kakuta | H01L 23/3121 361/807 |
| 2011/0031634 A1 * | 2/2011 | Pagaila | H01L 24/96 257/777 |
| 2011/0175239 A1 | 7/2011 | Harada et al. | |
| 2012/0139097 A1 * | 6/2012 | Jin | H01L 23/3142 257/712 |
| 2012/0228780 A1 | 9/2012 | Kim et al. | |
| 2015/0255427 A1 * | 9/2015 | Sung | H01L 24/73 257/737 |

* cited by examiner

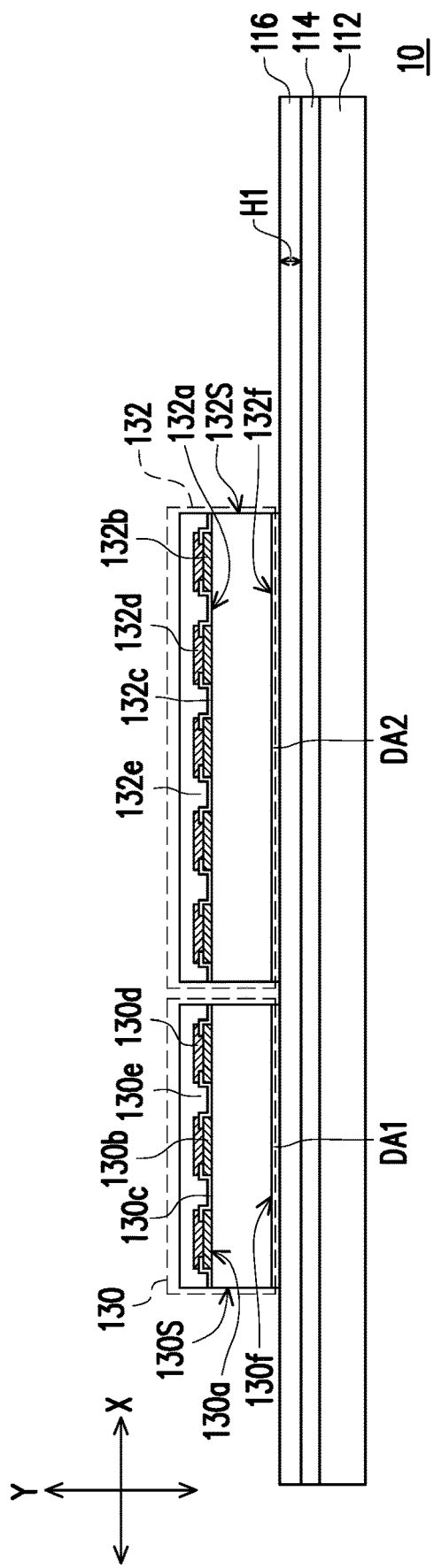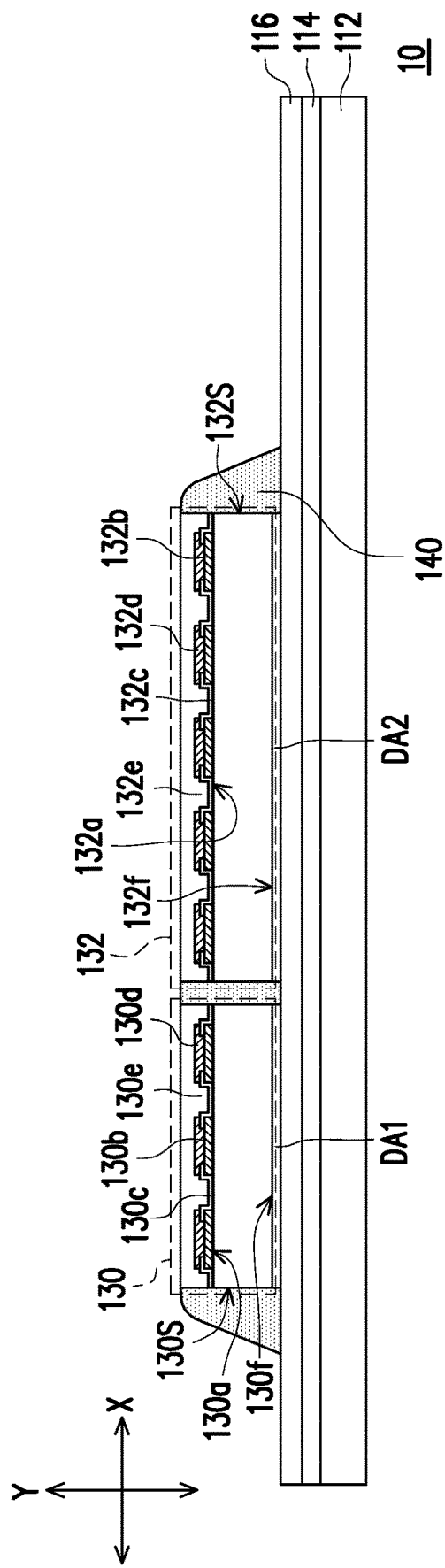
FIG. 1
FIG. 2

SEMICONDUCTOR PACKAGE AND METHOD MANUFACTURING THE SAME

CROSS-REFERENCE TO RELATED APPLICATION

This application is a continuation application of and claims the priority benefit of a prior application Ser. No. 16/402,239, filed on May 3, 2019. The prior application Ser. No. 16/402,239 is a continuation application of and claims the priority benefits of U.S. application Ser. No. 15/854,720, filed on Dec. 26, 2017, which claims the priority benefit of U.S. provisional application Ser. No. 62/527,044, filed on Jun. 30, 2017. The entirety of each of the above-mentioned patent applications is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many semiconductor integrated circuits are typically manufactured on a single semiconductor wafer. Dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 6 illustrate cross-sectional views of various stages of manufacturing a semiconductor package in accordance with some exemplary embodiments of the present disclosure.

DETAILED DESCRIPTION

Figure 3:
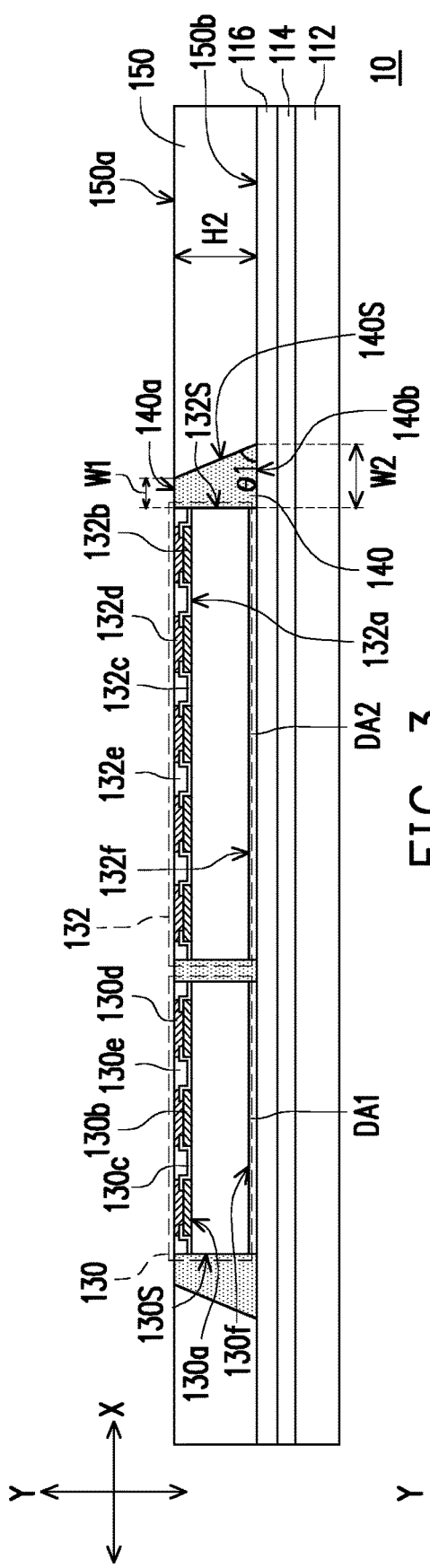

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 6 illustrate cross-sectional views of various stages of manufacturing a semiconductor package in accordance with some exemplary embodiments of the present disclosure. In FIG. 1 to FIG. 6, a semiconductor package 10 is shown to represent a package structure obtained following the manufacturing method, for example. In some embodiments, two integrated circuit components or semiconductor devices are shown to represent plural integrated circuit components or semiconductor devices of the wafer; and in addition, one or more packages are shown to represent plural semiconductor packages obtained following the semiconductor manufacturing method, the disclosure is not limited thereto.

Referring to FIG. 1, in some embodiments, a carrier 112 with a debond layer 114 and a buffer layer 116 coated thereon is provided. In one embodiment, the carrier 112 may be a glass carrier or any suitable carrier for carrying a semiconductor wafer or a reconstituted wafer for the manufacturing method of the semiconductor package.

In some embodiments, the debond layer 114 is disposed on the carrier 112, and the material of the debond layer 114 may be any material suitable for bonding and debonding the carrier 112 from the above layer(s) (e.g., the buffer layer 116) or any wafer(s) disposed thereon. In some embodiments, the debond layer 114 may include a release layer (such as a light-to-heat conversion ("LTHC") layer) and an adhesive layer (such as an ultra-violet curable adhesive or a heat curable adhesive layer).

As shown in FIG. 1, in some embodiments, the buffer layer 116 is disposed on the debond layer 114, and the debond layer 114 is located between the carrier 112 and the buffer layer 116. In some embodiments, the buffer layer 116 may be a dielectric material layer. In some embodiments, the buffer layer 116 may be a polymer layer which made of polyimide, polybenzoxazole (PBO), benzocyclobutene (BCB), or any other suitable polymer-based dielectric material. In some embodiments, the buffer layer 116 may be Ajinomoto Buildup Film (ABF), Solder Resist film (SR), or the like. The top surface of the buffer layer 116 may be levelled and may have a high degree of coplanarity. In one embodiment, along a vertical direction Y (e.g., a stacking direction of the carrier 112, the debond layer 114 and the buffer layer 116), a thickness H1 of the buffer layer 116 is about 1 μm to 50 μm, however the disclosure is not limited thereto.

The debond layer 114 and the buffer layer 116 may be formed by a suitable fabrication technique such as spin-coating, lamination, deposition, or the like.

Continued on FIG. 1, in some embodiments, at least one integrated circuit component is provided. As shown in FIG. 1, at least one integrated circuit component includes an integrated circuit component 130 and an integrated circuit component 132 disposed on the buffer layer 116. In some embodiments, the integrated circuit component 130 and the integrated circuit component 132 are arranged aside to each other along a horizontal direction X (e.g. an arranging direction of the integrated circuit component 130 and the integrated circuit component 132), where the horizontal direction X is different from the vertical direction Y. In a certain embodiment, the horizontal direction X is perpendicular to the vertical direction Y. As shown in FIG. 1, only one integrated circuit component 130 and one integrated circuit component 132 are presented for illustrative purposes, however, it should be noted that one or more integrated circuit component 130 or integrated circuit component 132 may be provided.

In some embodiments, the integrated circuit component 130 includes an active surface 130a, a plurality of pads 130b distributed on the active surface 130a, a passivation layer 130c covering the active surface 130a and a portion of the pad 130b, a plurality of connecting pillars 130d connecting to the pads 130b, a protection layer 130e, and the backside surface 130f opposite to the active surface 130a. The pads 130b are partially exposed by the passivation layer 130c, the connecting pillars 130d are disposed on and electrically connected to the pads 130b, and the protection layer 130e covers the passivation layer 130c and the connecting pillars 130d. The pads 130b are aluminum pads or other suitable metal pads, for example. The connecting pillars 130d are copper pillars, copper alloy pillar or other suitable metal pillars, for example. In some embodiments, the passivation layer 130c and the protection layer 130e may be a polybenzoxazole (PBO) layer, a polyimide (PI) layer or other suitable polymers. In some alternative embodiments, the passivation layer 130c and the protection layer 130e may be made of inorganic materials, such as silicon oxide, silicon nitride, silicon oxynitride, or any suitable dielectric material. The material of the passivation layer 130c can be the same or different from the material of the protection layer 130e, for example. In an alternative embodiment, the integrated circuit component 130 may include the pads 130b distributed on the active surface 130a, the passivation layer 130c covering the active surface 130a and a portion of the pad 130b, the backside surface 130f opposite to the active surface 130a.

In some embodiments, the integrated circuit component 132 includes an active surface 132a, a plurality of pads 132b distributed on the active surface 132a, a passivation layer 132c covering the active surface 132a and a portion of the pad 132b, a plurality of connecting pillars 132d connecting to the pads 132b, a protection layer 132e, and the backside surface 132f opposite to the active surface 132a. The pads 132b are partially exposed by the passivation layer 132c, the connecting pillars 132d are disposed on and electrically connected to the pads 132b, and the protection layer 132e covers the passivation layer 132c and the connecting pillars 132d. The pads 132b are aluminum pads or other suitable metal pads, for example. The connecting pillars 132d are copper pillars, copper alloy pillar or other suitable metal pillars, for example. In some embodiments, the passivation layer 132c and the protection layer 132e may be a polybenzoxazole (PBO) layer, a polyimide (PI) layer or other suitable polymers. In some alternative embodiments, the passivation layer 132c and the protection layer 132e may be made of inorganic materials, such as silicon oxide, silicon nitride, silicon oxynitride, or any suitable dielectric material. The material of the passivation layer 132c can be the same or different from the material of the protection layer 132e, for example. In an alternative embodiment, the integrated circuit component 132 may include the pads 132b distributed on the active surface 132a, the passivation layer 132c covering the active surface 132a and a portion of the pad 132b, the backside surface 132f opposite to the active surface 132a.

In some embodiments, the integrated circuit component 130 and the integrated circuit component 132 are manufactured through a front end of line (FEOL) process. It should be appreciated that the illustration of the integrated circuit component 130, the integrated circuit component 132 and other components throughout all figures is schematic and is not in scale.

It is noted that, at least one integrated circuit component (e.g. the integrated circuit component 130 and the integrated circuit component 132) described herein may be referred as a chip or an integrated circuit (IC). In an alternative embodiment, the integrated circuit component 130 and the integrated circuit component 132 described herein may be semiconductor devices. In certain embodiments, the integrated circuit component 130 and the integrated circuit component 132 may include one or more digital chips, analog chips or mixed signal chips, such as application-specific integrated circuit ("ASIC") chips, sensor chips, wireless and radio frequency (RF) chips, memory chips, logic chips or voltage regulator chips. In one embodiment, the integrated circuit component 130 and the integrated circuit component 132 may be the same. In an alternative embodiment, the integrated circuit component 130 and the integrated circuit component 132 may be different from each other.

In certain embodiments, at least one integrated circuit component described herein, except for the integrated circuit component 130 and the integrated circuit component 132, may further include additional integrated circuit component(s) of the same type or different types. In an alternative embodiment, the additional integrated circuit component(s) may include digital chips, analog chips or mixed signal chips, such as ASIC chips, sensor chips, wireless and RF chips, memory chips, logic chips or voltage regulator chips. The disclosure is not limited thereto.

Continued on FIG. 1, in some embodiments, a connecting film DA1 is provided to the backside surface 130f of the integrated circuit component 130 and the buffer layer 116, and a connecting film DA2 is provided to the backside surface 132f of the integrated circuit component 132 and the buffer layer 116. Due to the connecting film DA1 and the connecting film DA2, the integrated circuit component 130 and the integrated circuit component 132 are adhered to the buffer layer 116. In certain embodiments, the connecting film DA1 and the connecting film DA2 may include die attach films. In one embodiment, the connecting film DA1 and the connecting film DA2 may include, but not limited to, epoxy-based resin, acrylic polymer, filler (such as silica, alumina, or the like), other suitable insulating material, or the like. In one embodiment, along the vertical direction Y, a thickness of the connecting film DA1 and/or the connecting film DA2 is about 3 µm to 20 µm. In an alternative embodiment, along the vertical direction Y, the thickness of the connecting film DA1 and/or the connecting film DA2 is about 20 µm to 50 µm. The disclosure is not limited thereto.

Figure 10:
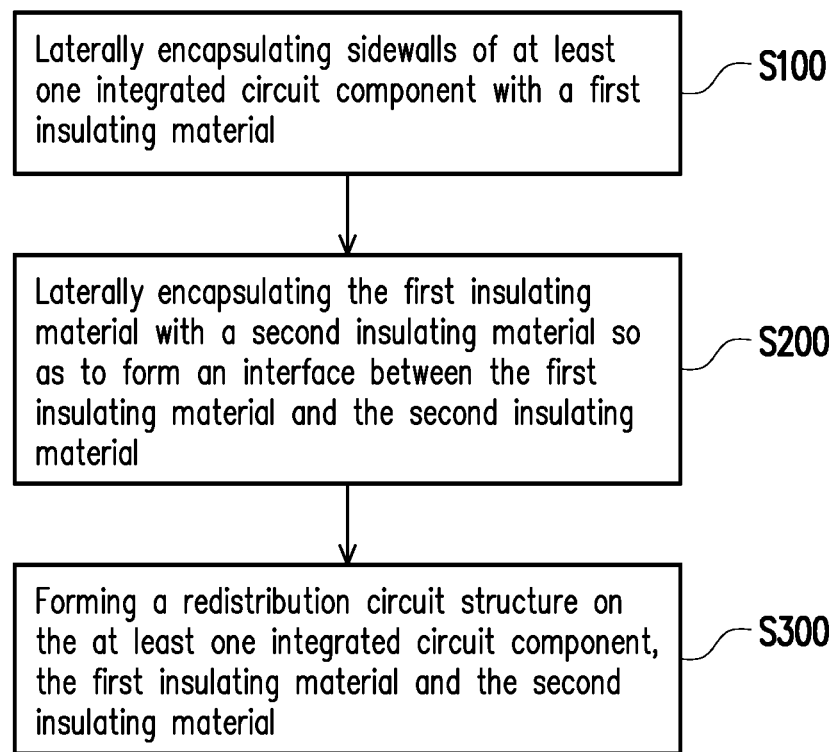
FIG. 10 is a flow chart illustrating a method of manufacturing a semiconductor package in accordance with some exemplary embodiments of the present disclosure.

Referring to FIG. 2, in some embodiments, an insulating encapsulation 140 is formed over the carrier 112, where the integrated circuit component 130 and the integrated circuit component 132 are encapsulated in insulating encapsulation 140 (also see FIG. 10, step S100). In some embodiments, the protection layer 130e of the integrated circuit component 130 and the protection layer 132e of the integrated circuit component 132 are exposed by the insulating encapsulation 140. In some embodiments, the insulating encapsulation 140 at least fills the gaps between the integrated circuit component 130 and the integrated circuit component 132 and between the connecting film DA1 and the connecting film DA2. In certain embodiments, a sidewall 130S of the integrated circuit component 130 and a sidewall 132S of the integrated circuit component 132 are covered by the insulating encapsulation 140. In certain embodiments, a sidewall of the connecting film DA1 and a sidewall of the connecting film DA2 are covered by the insulating encapsulation 140.

In some embodiments, the insulating encapsulation 140 includes a glue or a glue material, and the insulating encapsulation 140 is formed by glue dispensing. In some embodiments, the insulating encapsulation 140 includes an insulator material (such as epoxy-based polymer or the like), an insulator material having fillers (such as silica, alumina, or the like), or the like. Due to the insulating encapsulation 140, the adhesion degrees of the integrated circuit component 130 and the integrated circuit component 132 to the buffer layer 116 are further enhanced.

Referring to FIG. 3, an insulating encapsulation 150 is formed over the carrier 112 by over-molding the insulating encapsulation 140, the integrated circuit component 130 and the integrated circuit component 132 with an insulating material (not shown) and planarizing the insulating material, the insulating encapsulation 140, the integrated circuit component 130 and the integrated circuit component 132 (also see FIG. 10, step S200). As shown in FIG. 3, in some embodiments, after the planarizing step, the connecting pillars 130d of the integrated circuit component 130 is exposed by the protection layer 130e, the connecting pillars 132d of the integrated circuit component 132 is exposed by the protection layer 132e. In some embodiments, top surfaces of the integrated circuit component 130 and the integrated circuit component 132 are exposed by the insulating encapsulation 140 and the insulating encapsulation 150.

As shown in FIG. 3, in some embodiments, the insulating encapsulation 140 has a top surface 140a, a bottom surface 140b opposite to the top surface 140a and a sidewall 140S connecting the top surface 140a and the bottom surface 140b, where the top surface 140a is coplanar with top surfaces of the connecting pillars 130d and the protection layer 130e of the integrated circuit component 130 and top surfaces of the connecting pillars 132d and the protection layer 132e of the integrated circuit component 132. In other words, the connecting pillars 130d and the protection layer 130e of the integrated circuit component 130 and the connecting pillars 132d and the protection layer 132e of the integrated circuit component 132 are accessibly exposed by the insulating encapsulation 140.

In some embodiments, an area of the top surface 140a is small than an area of the bottom surface 140b in a vertical projection on the buffer layer 116. In one embodiment, along the horizontal direction X on the top surface 140a of the insulating encapsulation 140, a lateral distance W1 measured from the sidewall 140S of the insulating encapsulation 140 to the sidewall 130S of the integrated circuit component 130 or from the sidewall 140S of the insulating encapsulation 140 to the sidewall 132S of the integrated circuit component 132 is approximately ranging from 2 µm to 20 µm, however the disclosure is not limited thereto. In an alternative embodiment, the lateral distance W1 is approximately ranging from 5 µm to 300 µm. In an alternative embodiment, the lateral distance W1 is approximately above 300 µm.

On the other hand, in one embodiment, along the horizontal direction X on the bottom surface 140b of the insulating encapsulation 140, a lateral distance W2 measured from the sidewall 140S of the insulating encapsulation 140 to the sidewall 130S of the integrated circuit component 130 or from the sidewall 140S of the insulating encapsulation 140 to the sidewall 132S of the integrated circuit component 132 is approximately ranging from 10 µm to 100 µm, however the disclosure is not limited thereto. In an alternative embodiment, the lateral distance W2 is approximately ranging from 100 µm to 500 µm. In an alternative embodiment, the lateral distance W2 is approximately above 500 µm. In addition, along the vertical direction Y, a thickness of insulating encapsulation 140 is greater than a thickness of the integrated circuit component 130 or/and a thickness of the integrated circuit component 132.

In certain embodiments, the sidewall 140S and the bottom surface 140b of the insulating encapsulation 140 constitute an angle θ1, where the angle θ1 is an acute angle. In one embodiment, a range of the angle θ1 is about from 0.5° to 30°. In an alternative embodiment, the range of the angle θ1 is about from 30° to 60°. In an alternative embodiment, the range of the angle θ1 is about from 60° to 85°. The disclosure is not limited thereto.

Continued on FIG. 3, in some embodiments, the sidewall 130S of the integrated circuit component 130 and the sidewall 132S of the integrated circuit component 132 are covered by the insulating encapsulation 140, the sidewall 140S of the insulating encapsulation 140 is covered by the insulating encapsulation 150, and the integrated circuit component 130 and the integrated circuit component 132 are separated from the insulating encapsulation 150 by the insulating encapsulation 140. That is, for example, the insulating encapsulation 140 is sandwiched between the integrated circuit component 130 and the insulating encapsulation 150 and between the integrated circuit component 132 and the insulating encapsulation 150. In other words, the sidewall 130S of the integrated circuit component 130 and the sidewall 132S of the integrated circuit component 132 are free of the insulating encapsulation 150. In the disclosure, the material of the insulating encapsulation 140 is different from the material of the insulating encapsulation 150. That is, the sidewall 140S of the insulating encapsulation 140 is referred as an interface of the insulating encapsulation 140 and the insulating encapsulation 150, where the interface is clearly shown in FIG. 3.

In some embodiments, the insulating encapsulation 140 may differ from the insulating encapsulation 150 in modulus, CTE, and thermal conductivity.

In certain embodiments, there exists fillers in the insulating encapsulation 150 for advanced packaging, where the modulus of the insulating encapsulation 150 may approximately range from about 5 GPa to about 30 GPa, the CTE of the insulating encapsulation 150 may approximately range from about 5 ppm/K to about 20 ppm/K (below a glass transition temperature (Tg) of the insulating encapsulation 150), and the thermal conductivity of the insulating encapsulation 150 may approximately range from about 1 W/mK to about 20 W/mK. In an alternative embodiment of having fillers in the insulating encapsulation 150, the modulus of the insulating encapsulation 150 may be approximately greater than 30 GPa, the CTE of the insulating encapsulation 150 may be approximately greater than 20 ppm/K (below the Tg of the insulating encapsulation 150), and the thermal conductivity of the insulating encapsulation 150 may be approximately greater than 20 W/mK.

On the other hand, the insulating encapsulation 140, for example, does not necessarily bear these criteria in the advanced packaging; and that is, there may not be fillers in the insulating encapsulation 140, where the modulus of the insulating encapsulation 140 may approximately range from about 1 GPa to about 10 GPa, the CTE of the insulating encapsulation 140 may approximately range from about 20 ppm/K to about 60 ppm/K (below a Tg of the insulating encapsulation 140), and the thermal conductivity of the insulating encapsulation 140 may approximately range from about 0.1 W/mK to about 5 W/mK. In an alternative embodiment of having no filler in the insulating encapsulation 140, the modulus of the insulating encapsulation 140 may approximately range from about 1 GPa to about 10 GPa, the CTE of the insulating encapsulation 140 may be approximately greater than 60 ppm/K (below the Tg of the insulating encapsulation 140), and the thermal conductivity of the insulating encapsulation 140 may approximately range from about 0.1 W/mK to about 5 W/mK.

As shown in FIG. 3, in some embodiments, a top surface 150a of the insulating encapsulation 150 is substantially levelled with and coplanar to the top surface 140a of the insulating encapsulation 140, the top surfaces of the connecting pillars 130d and the protection layer 130e of the integrated circuit component 130 and the top surfaces of the connecting pillars 132d and the protection layer 132e of the integrated circuit component 132. In other words, the top surface 140a of the insulating encapsulation 140, the connecting pillars 130d and the protection layer 130e of the integrated circuit component 130 and the connecting pillars 132d and the protection layer 132e of the integrated circuit component 132 are accessibly exposed by the insulating encapsulation 150. On the other hand, a bottom surface 150b of the insulating encapsulation 150 is substantially levelled with and coplanar to the bottom surface 140b of the insulating encapsulation 140.

In one embodiment, along the vertical direction Y, a thickness H2 of the insulating encapsulation 150 may be ranging from 50 μm to 200 μm; however, the disclosure is not limited thereto. In an alternative embodiment, the thickness H2 of the insulating encapsulation 150 may be ranging from 200 μm to 500 μm. In an alternative embodiment, the thickness H2 of the insulating encapsulation 150 may be above 500 μm. In some embodiments, the material of the insulating encapsulation 150 may include epoxy resins, phenolic resins or silicon-containing resins, or any suitable materials; inorganic filler or inorganic compound (e.g. silica, clay, and so on).

Figure 4:
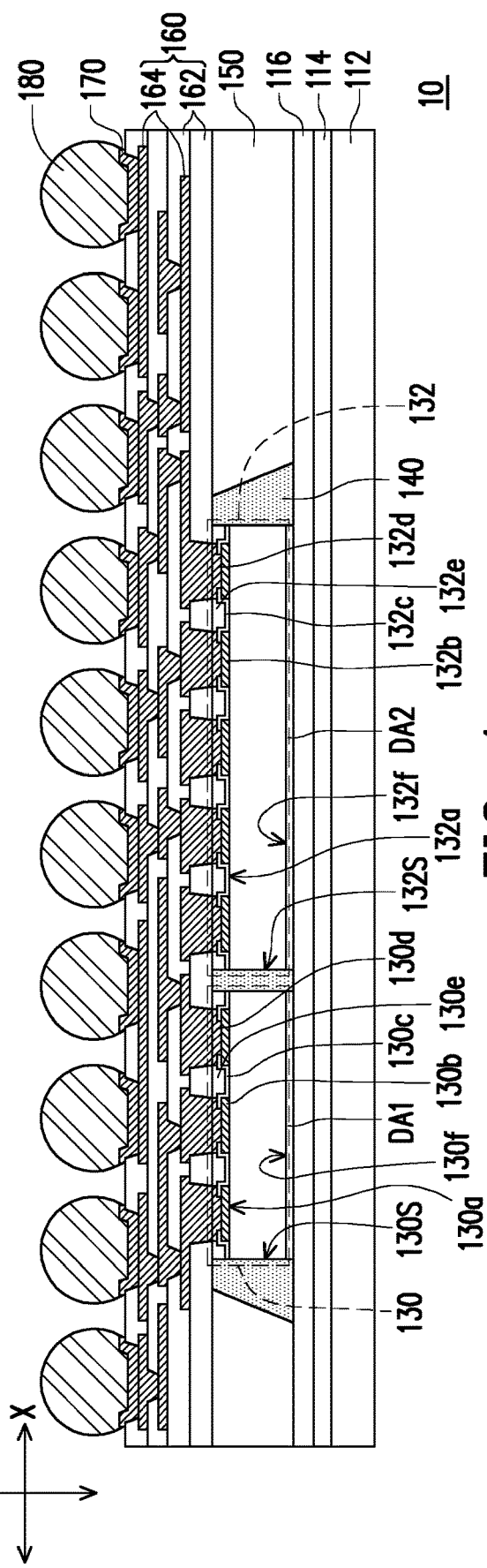

Referring to FIG. 4, in some embodiments, a redistribution circuit structure 160 is formed on the carrier 112. In some embodiments, the redistribution circuit structure 160 is a front-side redistribution layer electrically connected to the integrated circuit component 130 and the integrated circuit component 132. In some embodiments, the redistribution circuit structure 160 is formed on the integrated circuit component 130, the integrated circuit component 132, the insulating encapsulation 140 and the insulating encapsulation 150 (also see FIG. 10, step S300), where the redistribution circuit structure 160 is electrically connected to the integrated circuit component 130 and the integrated circuit component 132 by the connecting pillars 130d and the connecting pillars 132d, respectively. Through the redistribution circuit structure 160, the integrated circuit component 130 and the integrated circuit component 132 are electrically connected to each other. In other words, the integrated circuit component 130 communicates to the integrated circuit component 132 through the presence of the redistribution circuit structure 160, and vise versa.

The formation of the redistribution circuit structure 160 includes sequentially forming one or more polymer dielectric layers 162 and one or more metallization layers 164 in alternation. In certain embodiments, as shown in FIG. 4, the metallization layers 164 are sandwiched between the polymer dielectric layers 162, where the top surface of the topmost layer of the metallization layers 164 is exposed by the topmost layer of the polymer dielectric layers 162, and the lowest layer of the metallization layers 164 is connected to the connecting pillars 130d of the integrated circuit component 130 and the connecting pillars 132d of the integrated circuit component 132.

In some embodiments, the material of the polymer dielectric layers 162 includes polyimide, epoxy resin, acrylic resin, phenol resin, benzocyclobutene (BCB), polybenzoxazole (PBO), or any other suitable polymer-based dielectric material, and the polymer dielectric layers 162 may be formed by deposition. In some embodiments, the material of the metallization layers 164 includes aluminum, titanium, copper, nickel, tungsten, and/or alloys thereof, and the metallization layers 164 may be formed by electroplating or deposition. In certain embodiments, as the underlying insulating encapsulation 140 and insulating encapsulation 150 provide better planarization and evenness, the later-formed redistribution circuit structure 160, especially the metallization layer with thin line width or tight spacing, can be formed with uniform line-widths or even profiles, resulting in improved line/wiring reliability.

Continued on FIG. 4, in some embodiments, a plurality of under-ball metallurgy (UBM) patterns 170 may be disposed on some of the top surface of the topmost layer of the metallization layers 164 exposed by the topmost layer of the polymer dielectric layers 162 for electrically connecting with conductive elements (e.g. conductive balls). As shown in FIG. 4, for example, a plurality of the UBM patterns 170 is formed. In some embodiments, the material of the UBM patterns 170 may include copper, nickel, titanium, tungsten, or alloys thereof or the like, and may be formed by an electroplating process. The shape and number of the UBM patterns 170 is not limited in this disclosure.

In some embodiments, after the redistribution circuit structure 160 is formed, a plurality of conductive elements 180 is formed on the redistribution circuit structure 160, and is electrically connected to the redistribution circuit structure 160 through the UBM patterns 170. In some embodiments, the redistribution circuit structure 160 is located between the integrated circuit component 130 and the conductive elements 180, between the integrated circuit component 132 and the conductive elements 180, between the insulating encapsulation 140 and the conductive elements 180, and between the insulating encapsulation 150 and the conductive elements 180. As shown in FIG. 4, the conductive elements 180 are physically connected to the UBM patterns 170. In some embodiments, the conductive elements 180 are electrically connected to the redistribution circuit structure 160 through the UBM patterns 170. In some embodiments, some of the conductive elements 180 are electrically connected to the integrated circuit component 130 through the UBM patterns 170, the redistribution circuit structure 160, and the connecting pillars 130d of the integrated circuit component 130. In some embodiments, some of the conductive elements 180 are electrically connected to the integrated circuit component 132 through the UBM patterns 170, the redistribution circuit structure 160, and the connecting pillars 132d of the integrated circuit component 132.

In some embodiments, the conductive elements 180 may be disposed on the UBM patterns 170 by ball placement process or reflow process. In some embodiments, the conductive elements 180 may be solder balls or ball grid array (BGA) balls.

Figure 5:
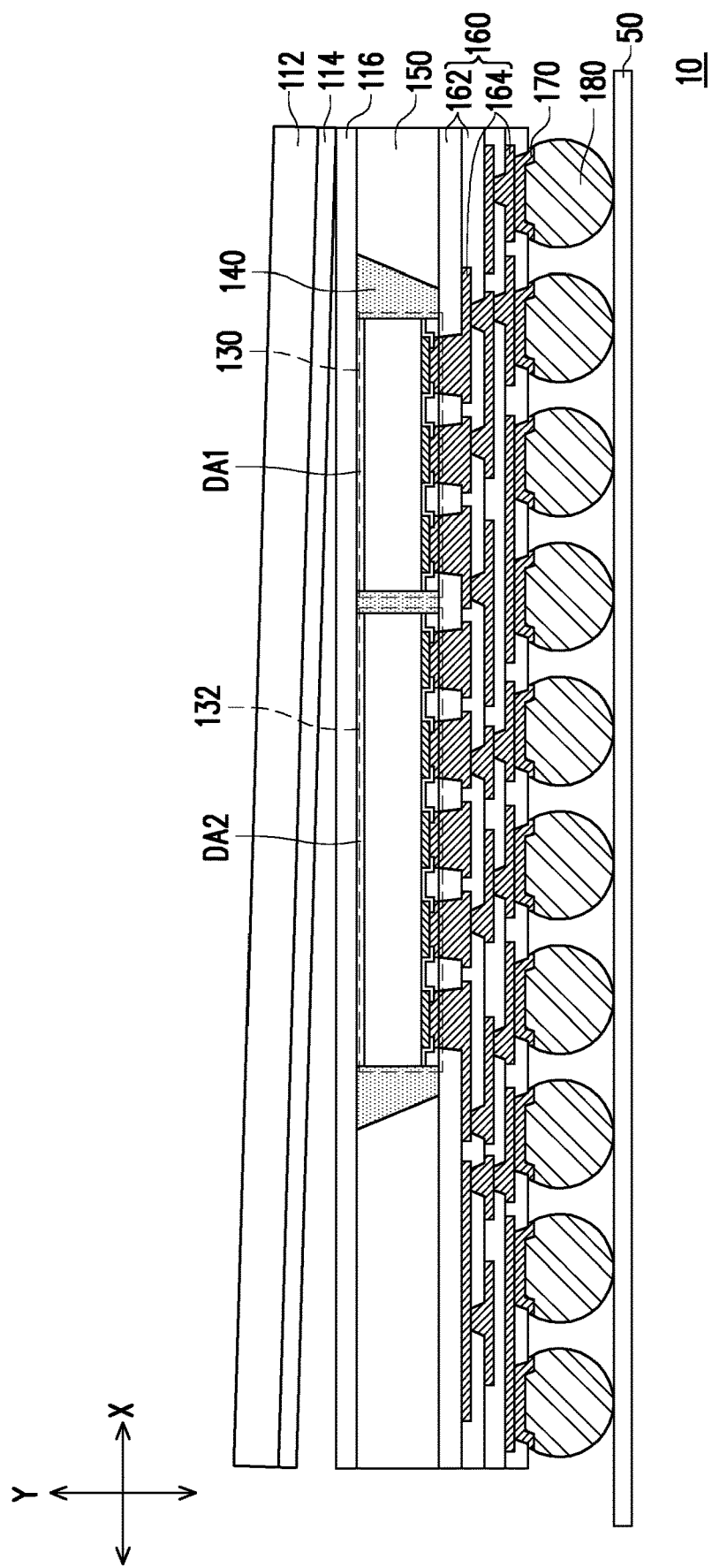

Referring to FIG. 5, in some embodiments, the carrier 112 is flipped (turned upside down) and then debonded from the buffer layer 116. In some embodiments, the buffer layer 116 is easily separated from the carrier 112 due to the debond layer 114. In some embodiments, the carrier 112 is detached from the buffer layer 116 through a debonding process, where the carrier 112 and the debond layer 114 are removed, and the buffer layer 116 is exposed. During the debonding step, a holding device 50 is adopted to secure the semiconductor package 10 before debonding the carrier 112 and the debond layer 114. As shown in FIG. 5, for example, the holding device 50 may be an adhesive tape, an adhesive carrier or a suction pad.

In some embodiments, the buffer layer 116 remained on the integrated circuit component 130, the integrated circuit component 132, the insulating encapsulation 140 and the insulating encapsulation 150 is served as a protection layer. Alternatively, in some embodiments, the buffer layer 116 may be subsequently removed, and a surface of each of the integrated circuit component 130, the integrated circuit component 132, the insulating encapsulation 140 and the insulating encapsulation 150 is exposed.

Figure 6:
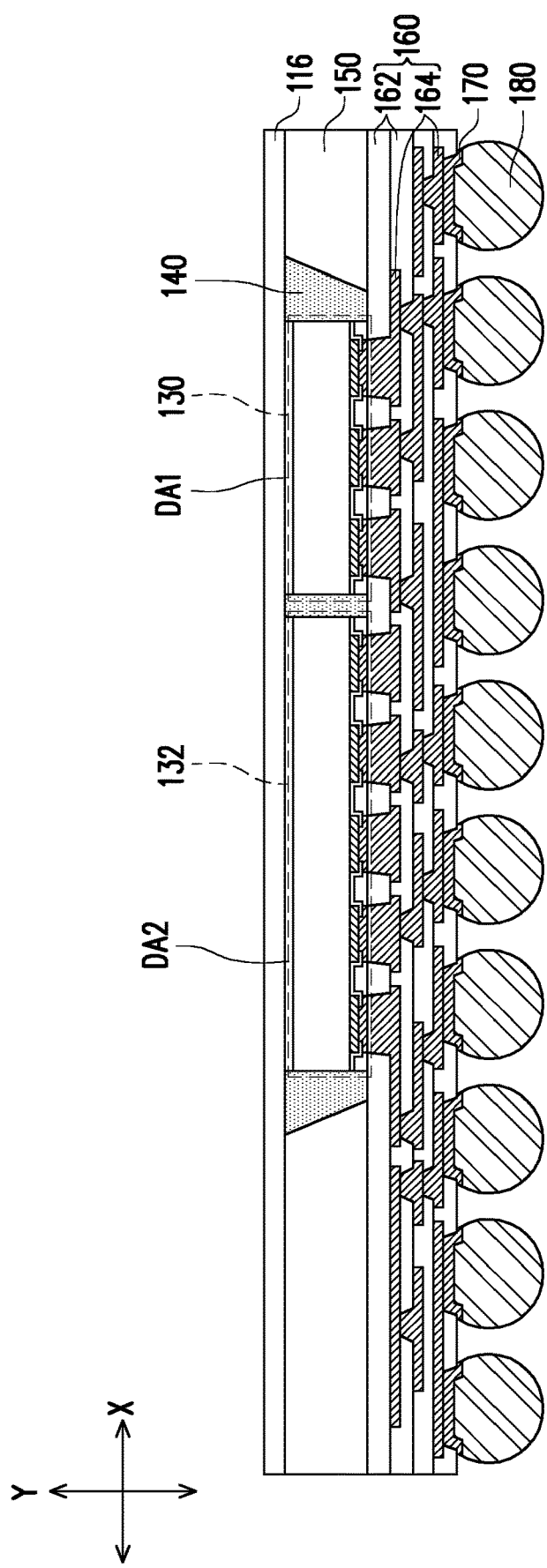

Referring to FIG. 6, in some embodiments, the conductive elements 180 are released from the holding device 50 to form the semiconductor package 10. In some embodiments, a dicing process is performed to cut the wafer of a plurality of the semiconductor package 10 into individual and separated semiconductor package 10. In one embodiment, the dicing process is a wafer dicing process including mechanical blade sawing or laser cutting. Up to here, the manufacture of the semiconductor package 10 is completed.

Figure 7:
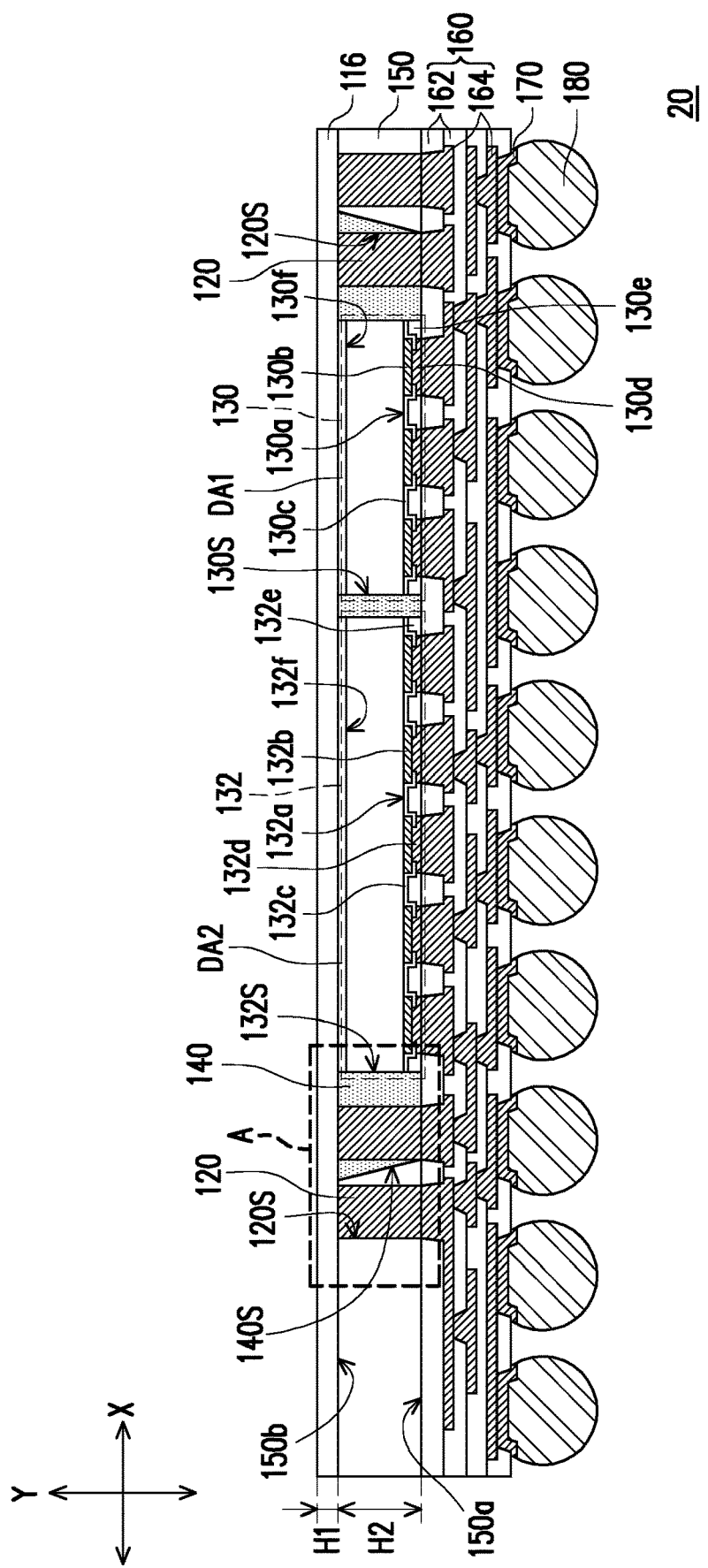
FIG. 7 illustrates a cross-sectional view of a semiconductor package in accordance with some exemplary embodiments of the present disclosure.
Figure 8A:
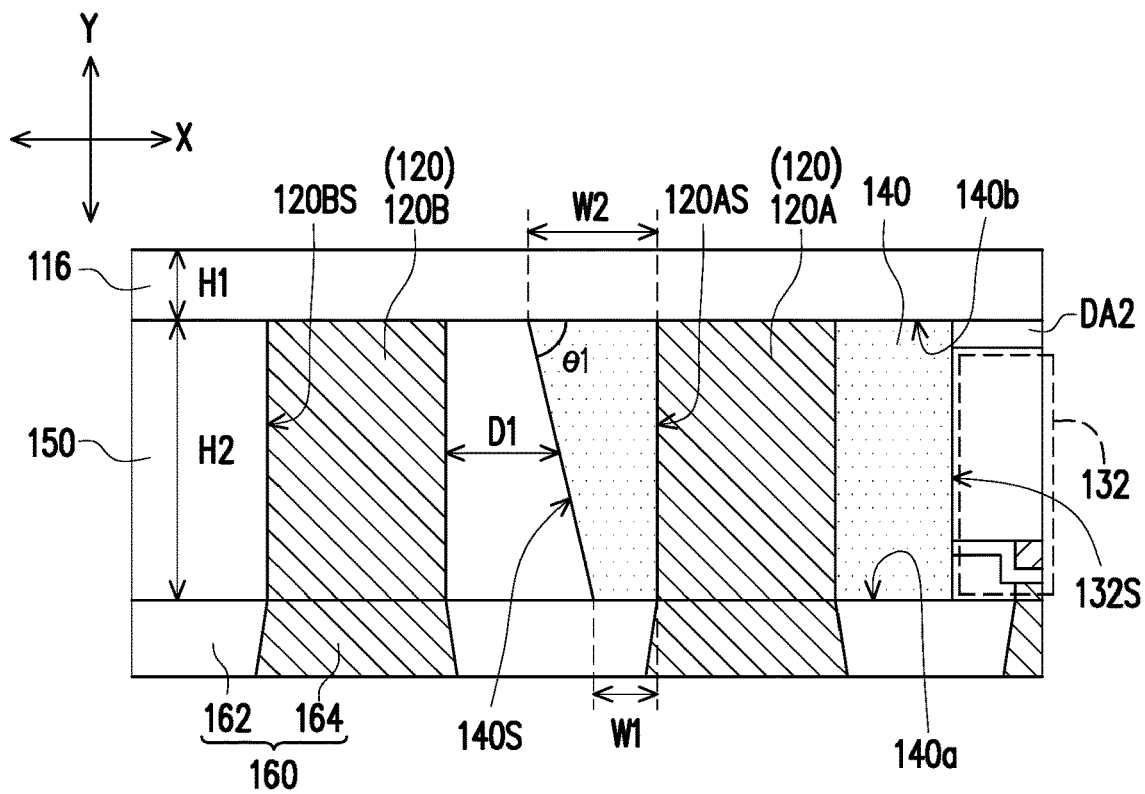
FIG. 8A is a schematic enlarged cross sectional view illustrating a part of the semiconductor package depicted in FIG. 7.
Figure 8B:
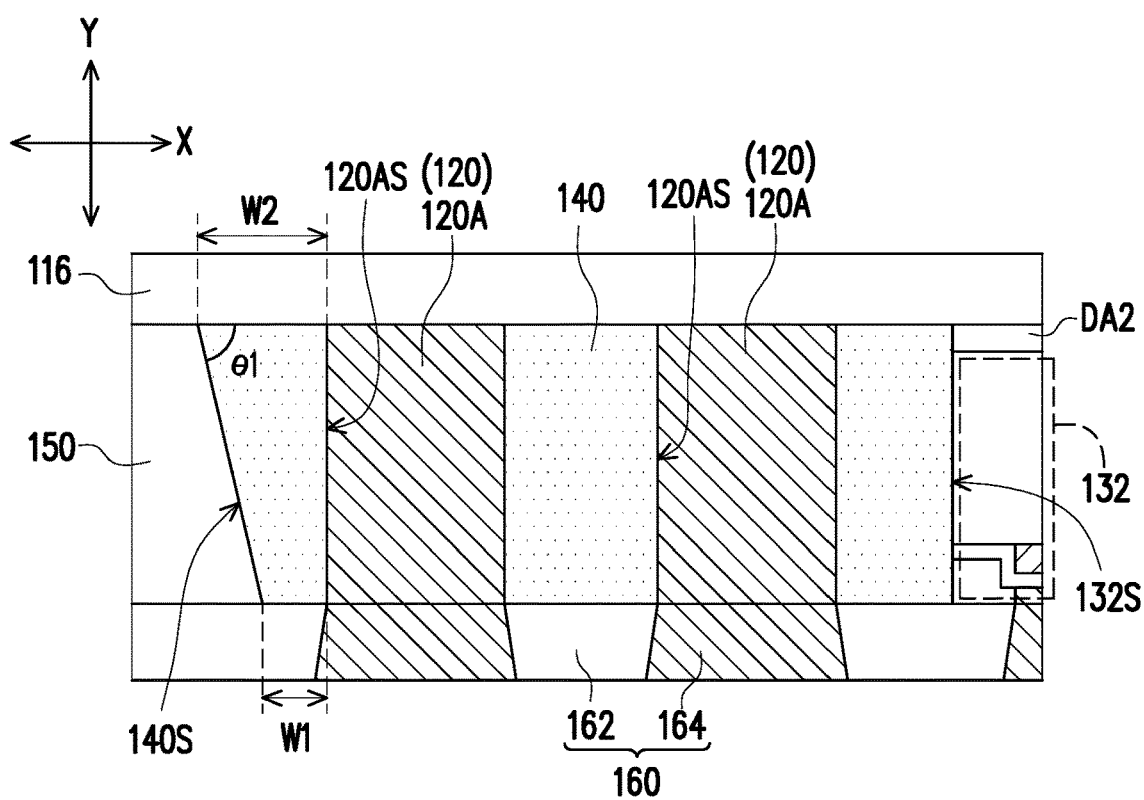
FIG. 8B is a schematic enlarged cross sectional view illustrating a part of the semiconductor package in accordance with some exemplary embodiments of the present disclosure.
Figure 8C:
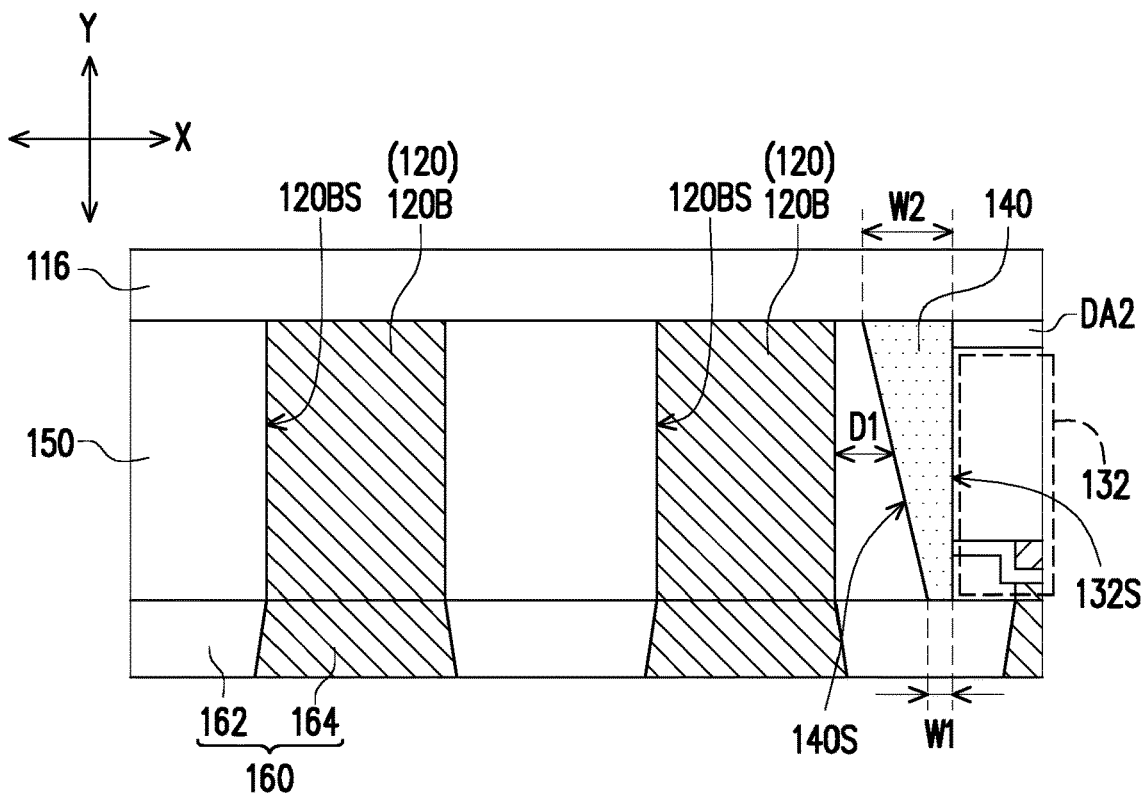
FIG. 8C is a schematic enlarged cross sectional view illustrating a part of the semiconductor package in accordance with some exemplary embodiments of the present disclosure.
Figure 8D:
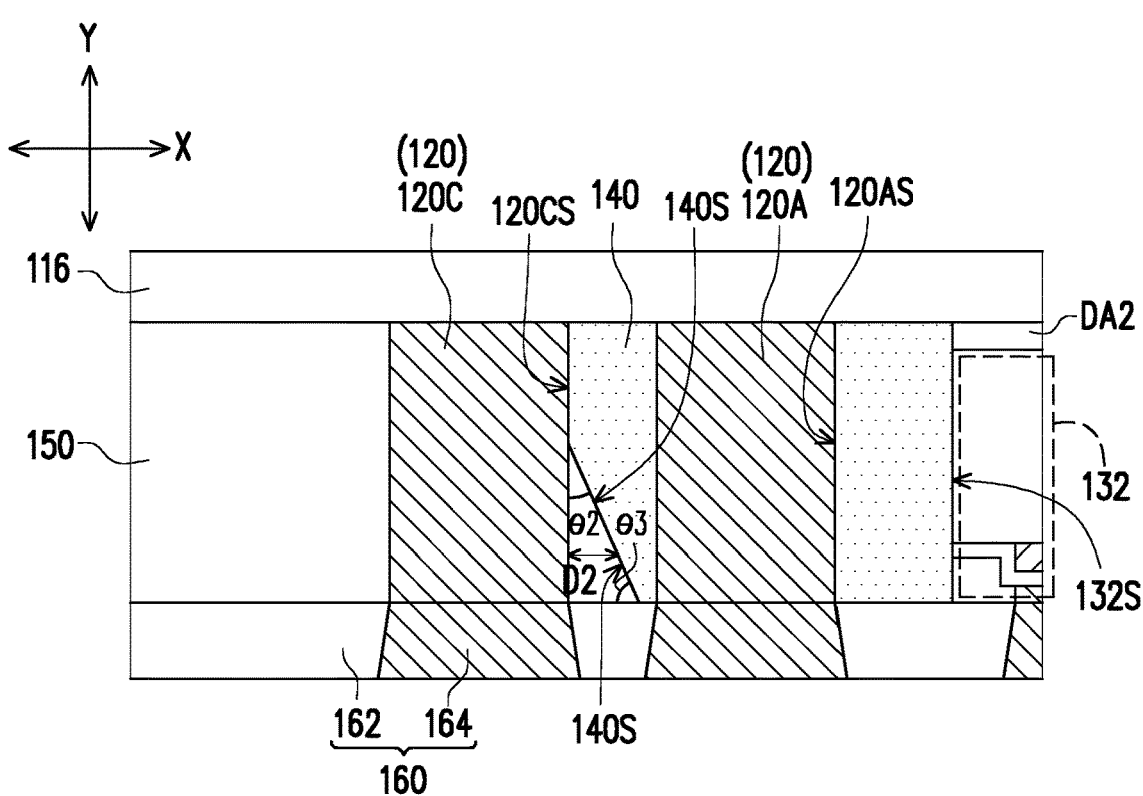
FIG. 8D is a schematic enlarged cross sectional view illustrating a part of the semiconductor package in accordance with some exemplary embodiments of the present disclosure.

FIG. 7 illustrates a cross-sectional view of a semiconductor package in accordance with some exemplary embodiments of the present disclosure. FIG. 8A is a schematic enlarged cross sectional view illustrating a part of the semiconductor package depicted in FIG. 7. FIG. 8B is a schematic enlarged cross sectional view illustrating a part of the semiconductor package in accordance with some exemplary embodiments of the present disclosure. FIG. 8C is a schematic enlarged cross sectional view illustrating a part of the semiconductor package in accordance with some exemplary embodiments of the present disclosure. FIG. 8D is a schematic enlarged cross sectional view illustrating a part of the semiconductor package in accordance with some exemplary embodiments of the present disclosure. In FIG. 8A to FIG. 8D, only certain structural features including the buffer layer 116, the conductive pillars 120, the integrated circuit component 132, the connecting film DA2, the insulating encapsulation 140, the insulating encapsulation 150 and the redistribution circuit structure 160 are stressed for illustration purposes, and only two conductive pillars 120 are illustrated for easy illustration.

Referring to FIG. 6 and FIG. 7 together, the semiconductor package 10 depicted in FIG. 6 and the semiconductor package 20 depicted in FIG. 7 are similar, the difference is that, for the semiconductor package 20 depicted in FIG. 7, an additional element (e.g. one or more conductive pillars 120) is further disposed on the buffer layer 116. The elements similar to or substantially the same as the elements described above will use the same reference numbers, and certain details or descriptions of the same elements and the relationship thereof (e.g. the relative positioning configuration and electrical connection) will not be repeated herein.

Referring to FIG. 7, in some embodiments, prior to or after the formations of the integrated circuit component 130 and the integrated circuit component 132 described in FIG. 1, one or more conductive pillars 120 are formed on the buffer layer 116, and then the previously described manufacturing process as described in FIG. 2 to FIG. 6 above can be performed to obtain the semiconductor package 20 depicted in FIG. 7.

In some embodiments, the conductive pillars 120 are formed on the buffer layer 116, and the conductive pillars 120 are electrically connected to the redistribution circuit structure 160. In certain embodiments, as shown in FIG. 7, the conductive pillars 120 are located between the buffer layer 116 and the redistribution circuit structure 160. In some embodiments, the conductive pillars 120 are physically connected to the redistribution circuit structure 160. In some embodiments, some of the conductive pillars 120 are electrically connected to the integrated circuit component 130 through the redistribution circuit structure 160 and the connecting pillars 130d. In some embodiments, some of the conductive pillars 120 are electrically connected to the integrated circuit component 132 through the redistribution circuit structure 160 and the connecting pillars 132d. In some embodiments, some of the conductive pillars 120 are electrically connected to some of the conductive elements 180 through the redistribution circuit structure 160 and the respective UBM patterns 170.

In some embodiments, the conductive pillars 120 are through integrated fan-out (InFO) vias. In one embodiment, the material of the conductive pillars 120 may include a metal material such as copper or copper alloys, or the like.

In some embodiments, the conductive pillars 120 are formed by photolithography, plating, photoresist stripping processes or any other suitable method. In one embodiment, the conductive pillars 120 may be formed by forming a mask pattern having openings (not shown), where the mask pattern covers a portion of the buffer layer 116 and exposes another portion of the buffer layer 116 with the openings; forming a metallic material filling the openings to form the conductive pillars 120 by electroplating or deposition; and then removing the mask pattern. The material of the mask pattern may include a positive photo-resist or a negative photo-resist. However, the disclosure is not limited thereto.

In an alternative embodiment, the conductive pillars 120 may be formed by forming a seed layer (not shown) on the buffer layer 116; forming the mask pattern with openings exposing portions of the seed layer; forming the metallic material on the exposed portions of the seed layer to form the conductive pillars 120 by plating; removing the mask pattern; and then removing portions of the seed layer exposed by the conductive pillars 120. For example, the seed layer may be a titanium/copper composited layer. For simplification, only four conductive pillars 120 are presented in one semiconductor package 20 depicted in FIG. 7 for illustrative purposes. However, it should be noted that less or more than four conductive pillars 120 may be formed; the disclosure is not limited thereto. The number of the conductive pillars can be selected based on the demand.

In an example, as shown in FIG. 7 and FIG. 8A, some of the conductive pillars 120 are encapsulated in the insulating encapsulation 140 and some of the conductive pillars 120 are encapsulated in the insulating encapsulation 150, for instance.

Referring to FIG. 8A, the conductive pillars 120 includes at least one first conductive pillar 120A and at least one second conductive pillar 120B. In some embodiments, the first conductive pillar 120A is encapsulated in the insulating encapsulation 140, where a sidewall 120AS of the first conductive pillar 120A is covered by the insulating encapsulation 140, and the first conductive pillar 120A is separated from the insulating encapsulation 150 by the insulating encapsulation 140. In other words, the first conductive pillar 120A is surrounded by and in contact with the insulating encapsulation 140 and is free of the insulating encapsulation 150. In some embodiments, the second conductive pillar 120B is encapsulated in the insulating encapsulation 150, where a sidewall 120BS of the second conductive pillar 120B is covered by the insulating encapsulation 150, and the second conductive pillar 120B is separated from the insulating encapsulation 150 by the insulating encapsulation 140. In other words, the second conductive pillar 120B is surrounded by and in contact with the insulating encapsulation 150 and is free of the insulating encapsulation 140. As shown in FIG. 8A, the first conductive pillar 120A penetrates the insulating encapsulation 140, and the second conductive pillar 120B penetrates the insulating encapsulation 150.

In certain embodiments, as shown in FIG. 8A, the sidewall 140S and the bottom surface 140b of the insulating encapsulation 140 constitute an angle θ1, where the angle θ1 is an acute angle. In one embodiment, a range of the angle θ1 is about from 0.5° to 30°, however the disclosure is not limited thereto. In an alternative embodiment, the range of the angle θ1 is about from 30° to 60°. In an alternative embodiment, the range of the angle θ1 is about from 60° to 85°. The disclosure is not limited thereto.

In some embodiments, along the horizontal direction X on the top surface 140a of the insulating encapsulation 140, a lateral distance W1 measured from the sidewall 140S of the insulating encapsulation 140 to the sidewall 132S of the integrated circuit component 132 is approximately ranging from 2 μm to 20 μm, however the disclosure is not limited thereto. In an alternative embodiment, the lateral distance W1 is approximately ranging from 5 μm to 300 μm. In an alternative embodiment, the lateral distance W1 is approximately above 300 μm.

In some embodiments, along the horizontal direction X on the bottom surface 140b of the insulating encapsulation 140, a lateral distance W2 measured from the sidewall 140S of the insulating encapsulation 140 to the sidewall 132S of the integrated circuit component 132 is approximately ranging from 10 μm to 100 μm, however the disclosure is not limited thereto. In an alternative embodiment, the lateral distance W2 is approximately ranging from 100 μm to 500 μm. In an alternative embodiment, the lateral distance W2 is approximately above 500 μm.

In some embodiments, along the horizontal direction X, a maximum lateral distance D1 measured from the sidewall 140S of the insulating encapsulation 140 to the sidewall 120BS of the second conductive pillar 120B (e.g. the conductive pillar(s) 120 not covered by the insulating encapsulation 140) is approximately ranging from 5 μm to 100 μm, however the disclosure is not limited thereto. In an alternative embodiment, the maximum lateral distance D1 is approximately ranging from 100 μm to 500 μm. In an alternative embodiment, the maximum lateral distance D1 is approximately above 500 μm.

In certain embodiments, the thickness H2 of the insulating encapsulation 150 may be ranging from 50 μm to 200 μm; however, the disclosure is not limited thereto. In an alternative embodiment, the thickness H2 of the insulating encapsulation 150 may be ranging from 200 μm to 500 μm. In an alternative embodiment, the thickness H2 of the insulating encapsulation 150 may be above 500 μm. In some embodiments, the thickness H1 of the buffer layer 116 is about 1 μm to 50 μm.

Additionally, some various modifications of the configuration relationship of the conductive pillars 120, the insulating encapsulation 140 and the insulating encapsulation 150 are shown in FIG. 8B to FIG. 8D. However, the disclosure is not limited thereto.

Referring to FIG. 8B, the conductive pillars 120 includes at least two first conductive pillars 120A. In some embodiments, the first conductive pillars 120A are encapsulated in the insulating encapsulation 140, where a sidewall 120AS of each of the first conductive pillars 120A is covered by the insulating encapsulation 140, and the first conductive pillars 120A are separated from the insulating encapsulation 150 by the insulating encapsulation 140. In other words, the first conductive pillars 120A are surrounded by and in contact with the insulating encapsulation 140 and are free of the insulating encapsulation 150. As shown in FIG. 8B, the first conductive pillars 120A penetrates the insulating encapsulation 140.

Referring to FIG. 8C, the conductive pillars 120 includes at least two second conductive pillars 120B. In some embodiments, the second conductive pillars 120B are encapsulated in the insulating encapsulation 150, where a sidewall 120BS of each of the second conductive pillars 120B is covered by the insulating encapsulation 150, and the second conductive pillars 120B are separated from the insulating encapsulation 140 by the insulating encapsulation 150. In other words, the second conductive pillars 120B are surrounded by and in contact with the insulating encapsulation 150 and are free of the insulating encapsulation 140. As shown in FIG. 8C, the second conductive pillars 120B penetrates the insulating encapsulation 150.

In the disclosure, the angle θ1, the lateral distance W1, the lateral distance W2, and/or the maximum lateral distance D1 (between the interface and the sidewall(s) of the conductive pillar(s) 120 not covering by the insulating encapsulation 140) described in FIG. 8A also applied to the angle θ1, the lateral distance W1, the lateral distance W2, and/or the maximum lateral distance D1 described in FIG. 8B and FIG. 8C and thus will not be repeated herein.

Referring to FIG. 8D, the conductive pillars 120 includes at least one first conductive pillar 120A and at least one third conductive pillar 120C. In some embodiments, the first conductive pillar 120A is encapsulated in the insulating encapsulation 140, where a sidewall 120AS of the first conductive pillar 120A is covered by the insulating encapsulation 140, and the first conductive pillar 120A is separated from the insulating encapsulation 150 by the insulating encapsulation 140. In other words, the first conductive pillar 120A is surrounded by and in contact with the insulating encapsulation 140 and is free of the insulating encapsulation 150. As shown in FIG. 8D, the first conductive pillar 120A penetrates the insulating encapsulation 140. In some embodiments, the third conductive pillar 120C is encapsulated by the insulating encapsulating 140 and the insulating encapsulation 150, where a sidewall 120CS of the third conductive pillar 120C is partially covered by the insulating encapsulation 140 and is partially covered by the insulating encapsulation 150. In other words, the third conductive pillar 120C is surrounded by and in contact with the insulating encapsulation 140 and the insulating encapsulation 150. As shown in FIG. 8D, the third conductive pillar 120C penetrates the interface (e.g., the sidewall 140S) of the insulating encapsulation 140 and the insulating encapsulation 150.

In some embodiments, an angle θ2 is between the interface (e.g., the sidewall 140S) of the insulating encapsulation 140 and the insulating encapsulation 150 and the sidewall 120CS of the third conductive pillar 120C, where the angle θ2 is an acute angle. In one embodiment, a range of the angle θ2 is about from 1° to 30°. In an alternative embodiment, the range of the angle θ2 is about from 30° to 60°. In an alternative embodiment, the range of the angle θ2 is about from 60° to 89°.

In some embodiments, an angle θ3 is between the interface (e.g., the sidewall 140S) of the insulating encapsulation 140 and the insulating encapsulation 150 and an outer surface of the redistribution circuit structure 160, where the angle θ3 is equal to (90°−θ2). In other words, the angle θ3 is an acute angle.

In some embodiments, along the horizontal direction X, a maximum lateral distance D1 measured from the sidewall 140S of the insulating encapsulation 140 to the sidewall 120CS of the third conductive pillar 120C (e.g. the conductive pillar(s) 120 penetrating the interface of two different insulating encapsulations) is approximately ranging from 10 μm to 100 μm, however the disclosure is not limited thereto. In an alternative embodiment, the maximum lateral distance D2 is approximately ranging from 100 μm to 500 μm. In an alternative embodiment, the lateral distance D2 is approximately above 500 μm.

In an alternative embodiment (not shown), the conductive pillars 120 may include at least one second conductive pillar 120B and at least one third conductive pillar 120C, and the second conductive pillar 120B penetrates the insulating encapsulation 150 while the third conductive pillar 120C penetrates the interface of the insulating encapsulation 140 and the insulating encapsulation 150. In an alternative embodiment (not shown), the conductive pillars 120 may include at least one first conductive pillars 120A, at least one second conductive pillar 120B and at least one third conductive pillar 120C, and the first conductive pillars 120A and the second conductive pillar 120B respectively penetrate the insulating encapsulation 140 and the insulating encapsulation 150 while the third conductive pillar 120C penetrates the interface of the insulating encapsulation 140 and the insulating encapsulation 150. The above not shown embodiments may have the similar specifications of the angles θ1~θ3, the lateral distances W1~W2, and/or the maximum lateral distances D1~D2 described in FIG. 8A to FIG. 8D. The disclosure is not limited thereto.

During the packaging processes, the semiconductor package 10 depicted in FIG. 6 and/or the semiconductor package 20 depicted in FIG. 7 may be further mounted with additional packages, chips/dies or other electronic devices to form a PoP device.

Figure 9:
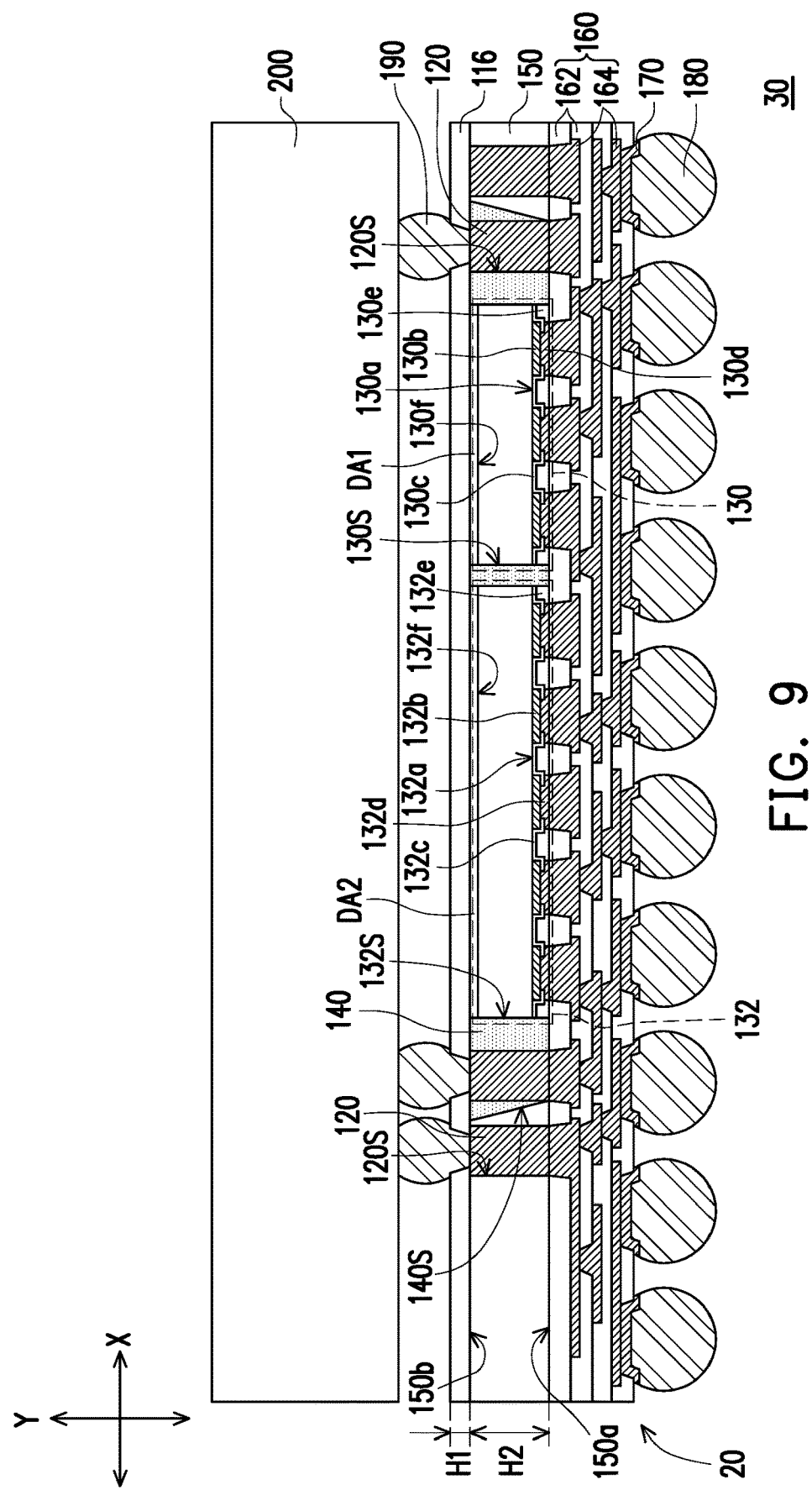
FIG. 9 illustrates a cross-sectional view of a semiconductor package in accordance with some exemplary embodiments of the present disclosure.

FIG. 9 illustrates a cross-sectional view of a semiconductor package in accordance with some exemplary embodiments of the present disclosure. In FIG. 9, for example, the semiconductor package 20 depicted in FIG. 7 is further mounted with an additional semiconductor device 200 to form a PoP device 30.

Referring to FIG. 9, in some embodiments, at least one semiconductor device 200 is provided, and connectors 190 are formed in a plurality of openings (not marked) in the buffer layer 116 to electrically connect the semiconductor device 200 and the semiconductor package 20. In some embodiments, the semiconductor device 200 is disposed on the semiconductor package 20 through connectors 190, where the connectors 190 are disposed on and in physical contact with the conductive pillars 120. The conductive pillars 120 are located between the redistribution circuit structure 160 and the connector 190, as shown in FIG. 9, for example. In some embodiments, the semiconductor device 200 is electrically connected to the redistribution circuit structure 160 through the connectors 190 and the conductive pillars 120. In some embodiments, through the connectors 190, the conductive pillars 120 and the redistribution circuit structure 160, the semiconductor device 200 is electrically connected to some of the conductive elements 180. In some embodiments, through the connectors 190, the conductive pillars 120 and the redistribution circuit structure 160, the semiconductor device 200 is electrically connected to the integrated circuit component 130. In an alternative embodiment, through the connectors 190, the conductive pillars 120 and the redistribution circuit structure 160, the semiconductor device 200 is electrically connected to the integrated circuit component 132. In an alternative embodiment, an underfill material (not shown) may be filled between the semiconductor device 200 and the semiconductor package 20. Up to here, the manufacture of the exemplary PoP device 30 is completed, but the disclosure is not limited thereto.

In accordance with some embodiments, a semiconductor package including at least one integrated circuit component and a glue material is provided. The at least one integrated circuit component has a top surface with conductive terminals and a backside surface opposite to the top surface. The glue material encapsulates the at least one integrated circuit component, wherein a first lateral thickness of the glue material is smaller than a second lateral thickness of the glue material, the second lateral thickness is parallel to the first lateral thickness, and the first lateral thickness is substantially coplanar with the top surface.

In accordance with some embodiments, a semiconductor package including a first semiconductor device, a second semiconductor device, an insulating encapsulation, and a redistribution circuit structure is provided. The first semiconductor device has a first surface with first conductive terminals. The second semiconductor device is electrically connected to the first semiconductor device and has a second surface with second conductive terminals. The insulating encapsulation includes a glue material and a molding compound. The glue material encapsulates the first semiconductor device and the second semiconductor device and is located therebetween. The molding compound encapsulates the glue material and is separated from the first semiconductor device and the second semiconductor device through the glue material. The redistribution circuit structure is located on the first semiconductor device and the second semiconductor device, wherein the redistribution circuit structure is directly connected to the first surface of the first semiconductor device, the second surface of the second semiconductor device, a third surface of the glue material, and a fourth surface of the molding compound.

In accordance with some embodiments, a semiconductor package including a first insulating encapsulation, at least one first integrated circuit component, conductive pillars, and a redistribution circuit structure is provided. The first insulating encapsulation has an area of a first surface smaller than an area of a second surface opposite to the first surface. The at least one first integrated circuit component has a third surface with conductive terminals and is embedded in the first insulating encapsulation, wherein the third surface is substantially coplanar to the first surface. The conductive pillars are located aside of the at least one first integrated circuit component. The redistribution circuit structure is located on the at least one first integrated circuit component and the conductive pillars, wherein the redistribution circuit structure is directly connected to the first surface of the first insulating encapsulation, the third surface of the at least one first integrated circuit component, and end surfaces of the conductive pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    at least one integrated circuit component having a first surface with conductive terminals;
    a glue material, encapsulating the at least one integrated circuit component and having a second surface and a third surface opposite to the second surface, wherein an area of the second surface is smaller than an area of the third surface, and the second surface of the glue material is coplanar with the first surface of the at least one integrated circuit component; and
    a buffer layer, disposed on the third surface, wherein the buffer layer is free of metal, and a sidewall of the buffer layer is a part of a sidewall of the semiconductor package, wherein the buffer layer is a continuous layer having a continuously leveled surface facing to the at least one integrated circuit component in one cross-sectional view, and the continuously leveled surface is in contact with the third surface.

2. The semiconductor package as claimed in claim 1, wherein a shape of a cross sectional of the glue material comprises a trapezoid.

3. The semiconductor package as claimed in claim 1, further comprising:
    a redistribution circuit structure, disposed on the at least one integrated circuit component and the glue material, and electrically connected to the at least one integrated circuit component; and
    an insulating encapsulation, laterally encapsulating the glue material, wherein a sidewall of the at least one integrated circuit component is covered by the glue material, and the at least one integrated circuit component is physically separated from the insulating encapsulation by the glue material.

4. The semiconductor package as claimed in claim 1, further comprising:
    an insulating encapsulation, laterally encapsulating the glue material, wherein a sidewall of the at least one integrated circuit component is covered by the glue material, and the at least one integrated circuit component is separated from the insulating encapsulation by the glue material;
    a plurality of conductive pillars, penetrating the insulating encapsulation and being in contact with the insulating encapsulation, wherein the plurality of conductive pillars is physically separated from the glue material by the insulating encapsulation; and
    a redistribution circuit structure, disposed on the at least one integrated circuit component, the glue material and the insulating encapsulation, and electrically connected to the at least one integrated circuit component and the plurality of conductive pillars.

5. The semiconductor package as claimed in claim 1, further comprising:
    an insulating encapsulation, laterally encapsulating the glue material, wherein a sidewall of the at least one integrated circuit component is covered by the glue material, and the at least one integrated circuit component is separated from the insulating encapsulation by the glue material;
    a plurality of conductive pillars, penetrating the glue material and being in contact with the glue material, wherein the plurality of conductive pillars is physically separated from the insulating encapsulation by the glue material; and
    a redistribution circuit structure, disposed on the at least one integrated circuit component, the glue material and the insulating encapsulation, and electrically connected to the at least one integrated circuit component and the plurality of conductive pillars.

6. The semiconductor package as claimed in claim 1, further comprising:
    an insulating encapsulation, laterally encapsulating the glue material, wherein a sidewall of the at least one integrated circuit component is covered by the glue material, and the at least one integrated circuit component is separated from the insulating encapsulation by the glue material;

at least one first conductive pillar, penetrating and being in contact with the glue material, wherein the at least one first conductive pillar and the insulating encapsulation are physically separated by the glue material;

at least one second conductive pillar, penetrating and being in contact with the insulating encapsulation, where the at least one second conductive pillar and the glue material are physically separated by the insulating encapsulation; and a redistribution circuit structure, disposed on the at least one integrated circuit component, the glue material and the insulating encapsulation, and electrically connected to the at least one integrated circuit component, the at least one first conductive pillar and the at least one second conductive pillar.

7. The semiconductor package as claimed in claim 6, further comprising:

at least one third conductive pillar, penetrating an interface of the glue material and the insulating encapsulation, wherein the at least one third conductive pillar is in contact with the glue material and the insulating encapsulation and is electrically connected to the redistribution circuit structure.

8. The semiconductor package as claimed in claim 1, further comprising:

an insulating encapsulation, laterally encapsulating the glue material, wherein a sidewall of the at least one integrated circuit component is covered by the glue material, and the at least one integrated circuit component is separated from the insulating encapsulation by the glue material;

a plurality of conductive pillars, penetrating an interface of the glue material and the insulating encapsulation, wherein the plurality of conductive pillars is in contact with the glue material and the insulating encapsulation; and a redistribution circuit structure, disposed on the at least one integrated circuit component, the glue material and the insulating encapsulation, and electrically connected to the at least one integrated circuit component and the plurality of conductive pillars.

9. A semiconductor package, comprising:

a first semiconductor device, comprising first conductive terminals, the first semiconductor device having a first surface exposing the first conductive terminals;

a second semiconductor device, located aside of and electrically connected to the first semiconductor device, the second semiconductor device comprising second conductive terminals and having a second surface exposing the second conductive terminals;

an insulating encapsulation, laterally encapsulating the first semiconductor device and the second semiconductor device, wherein the insulating encapsulation comprises:

an inner portion, laterally encapsulating the first semiconductor device and the second semiconductor device and having a top surface and a bottom surface opposite to the top surface, wherein an area of the top surface is smaller than an area of the bottom surface, and the top surface of the inner portion is closer to the first surface of the first semiconductor device than the bottom surface is, wherein there is an acute angle between a sidewall of the inner portion and the bottom surface; and an outer portion, laterally encapsulating the inner portion; and conductive pillars, embedded in the insulating encapsulation and electrically connected to the first semiconductor device and the second semiconductor device.

10. The semiconductor package as claimed in claim 9, further comprising:

a redistribution circuit structure, disposed on the insulating encapsulation and electrically connected to the first semiconductor device and the second semiconductor device; and conductive elements, located on and electrically connected to the redistribution circuit structure, wherein the redistribution circuit structure is located between the conductive elements and the insulating encapsulation, wherein in a stacking direction of the redistribution circuit structure and the insulating encapsulation, a height of the inner portion is substantially the same as a height of the outer portion.

11. The semiconductor package as claimed in claim 9, wherein the first semiconductor device and the second semiconductor device are free from the outer portion of the insulating encapsulation.

12. The semiconductor package as claimed in claim 9, wherein the first surface of first semiconductor device is substantially coplanar to the top surface of the inner portion and a top surface of the outer portion.

13. The semiconductor package as claimed in claim 12, wherein the first surface of the first semiconductor device is substantially levelled with the second surface of the second semiconductor device.

14. The semiconductor package as claimed in claim 9, wherein the conductive pillars comprise at least one of a plurality of first conductive pillars, a plurality of second conductive pillars, and a plurality of third conductive pillars, wherein:

the plurality of first conductive pillars penetrates the inner portion of the insulating encapsulation, and is physically separated from the outer portion of the insulating encapsulation by the inner portion of the insulating encapsulation, the plurality of second conductive pillars penetrates the outer portion of the insulating encapsulation, and is physically separated from the inner portion of the insulating encapsulation by the outer portion of the insulating encapsulation, and the plurality of third conductive pillars penetrates an interface of the inner portion of the insulating encapsulation and the outer portion of the insulating encapsulation, and is in physical contact with the inner portion of the insulating encapsulation and the outer portion of the insulating encapsulation.

15. The semiconductor package as claimed in claim 9, wherein a material of the inner portion is different from a material of the outer portion.

16. A method of manufacturing a semiconductor package, comprising:

providing at least one integrated circuit component having a first surface with conductive terminals disposed thereon over a buffer layer, wherein the buffer layer is free of metal, and a sidewall of the buffer layer is a part of a sidewall of the semiconductor package, wherein the buffer layer is a continuous layer having a continuously leveled surface facing to the at least one integrated circuit component in one cross-sectional view;

encapsulating the at least one integrated circuit component with a first insulating material having a top surface and a bottom surface opposite to the top surface, wherein an area of the top surface is smaller than an area of the bottom surface, and the top surface of the first insulating material is coplanar with the first surface of the at least one integrated circuit component;

encapsulating the first insulating material with a second insulating material, wherein the continuously leveled surface is in contact with the first insulating material and the second insulating material;

forming a redistribution circuit structure on the at least one integrated circuit component, the first insulating material and the second insulating material, wherein the redistribution circuit structure is electrically connected to the at least one integrated circuit component; and disposing conductive elements on the redistribution circuit structure to electrically connect to the at least one integrated circuit component.

17. The method as claimed in claim 16, prior to encapsulating the at least one integrated circuit component with the first insulating material, further comprising:

forming conductive pillars aside the at least one integrated circuit component, the conductive pillars being electrically connected to the redistribution circuit structure, wherein encapsulating the at least one integrated circuit component with the first insulating material further comprises encapsulating the conductive pillars with the first insulating material to physically separate the conductive pillars from the second insulating material.

18. The method as claimed in claim 16, prior to encapsulating the at least one integrated circuit component with the first insulating material, further comprising:

forming conductive pillars aside the at least one integrated circuit component, the conductive pillars being electrically connected to the redistribution circuit structure, wherein encapsulating the first insulating material with the second insulating material further comprises encapsulating the conductive pillars with the second insulating material to physically separate the conductive pillars from the first insulating material.

19. The method as claimed in claim 16, prior to encapsulating the at least one integrated circuit component with the first insulating material, further comprising:

forming conductive pillars aside the at least one integrated circuit component, the conductive pillars being electrically connected to the redistribution circuit structure and comprising at least one first conductive pillar and at least one second conductive pillar, wherein encapsulating the at least one integrated circuit component with the first insulating material further comprises encapsulating the at least one first conductive pillar with the first insulating material to physically separate the at least first conductive pillar from the second insulating material, and wherein encapsulating the first insulating material with the second insulating material further comprises encapsulating the at least one second conductive pillar with the second insulating material to physically separate the at least second conductive pillar from the first insulating material.

20. The method as claimed in claim 19, wherein the conductive pillars further comprise at least one third conductive pillar, wherein encapsulating the at least one integrated circuit component with the first insulating material further comprises encapsulating a portion of the at least one third conductive pillar with the first insulating material, and encapsulating the first insulating material with the second insulating material further comprises encapsulating a remained potion of the at least one third conductive pillar with the second insulating material to have the at least one third conductive pillar penetrate through an interface of the first insulating material and the second insulating material.

* * * * *